(12) United States Patent
Keinert et al.

(10) Patent No.: US 8,495,551 B2
(45) Date of Patent: Jul. 23, 2013

(54) SHAPING PORTS IN INTEGRATED CIRCUIT DESIGN

(75) Inventors: Joachim Keinert, Altdorf (DE); Thomas Ludwig, Sindelfingen (DE)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 12/946,179

(22) Filed: Nov. 15, 2010

(65) Prior Publication Data

US 2011/0154283 A1 Jun. 23, 2011

(30) Foreign Application Priority Data

Dec. 17, 2009 (EP) .................................... 09179689

(51) Int. Cl.
*G06F 17/50* (2006.01)

(52) U.S. Cl.
USPC .......................................................... 716/130

(58) Field of Classification Search
USPC .................................................. 716/100–139
See application file for complete search history.

(56) References Cited

U.S. PATENT DOCUMENTS

| | | | |
|---|---|---|---|
| 5,187,671 A | 2/1993 | Cobb | |
| 5,550,748 A | 8/1996 | Xiong | |
| 6,308,302 B1 | 10/2001 | Hathaway et al. | |
| 6,493,859 B1 | 12/2002 | Gould et al. | |
| 7,010,771 B2 | 3/2006 | Teig et al. | |
| 7,032,201 B1 | 4/2006 | Teig et al. | |
| 7,131,096 B1 | 10/2006 | Balsdon et al. | |
| 7,313,776 B2 | 12/2007 | Kaul et al. | |
| 7,480,885 B2 | 1/2009 | Frankle et al. | |
| 7,971,171 B2 | 6/2011 | Keinert et al. | |
| 2002/0120912 A1* | 8/2002 | He et al. ............................ | 716/12 |
| 2006/0136848 A1* | 6/2006 | Ichiryu et al. ..................... | 716/1 |
| 2009/0045836 A1 | 2/2009 | Herzl et al. | |
| 2009/0178013 A1 | 7/2009 | Wang et al. | |
| 2011/0113395 A1 | 5/2011 | Keinert et al. | |

FOREIGN PATENT DOCUMENTS

GB 2457126 A 8/2009

OTHER PUBLICATIONS

U.S. Appl. No. 12/861,087.
"Encounter Menu Reference", Cadence, Jun. 2006, 1320 pages.
Chen, Deming et al., "FPGA Design Automation: A Survey", Foundations and Trends in Electronic Design Automation, vol. 1, No. 3, Nov. 2006, pp. 195-330.
Iizuka, Tetsuya et al., "Timing-Driven Redundant Contact Insertion for Standard Cell Yield Enhancement", 13th IEEE International Conference on Electronics, Circuits and Systems, 2006, pp. 704-707.

* cited by examiner

*Primary Examiner* — Vuthe Siek
*Assistant Examiner* — Aric Lin
(74) *Attorney, Agent, or Firm* — Francis Lammes; Stephen J. Walder, Jr.; Libby Z. Toub

(57) ABSTRACT

A mechanism is provided for performing a detailed routing of a net joining ports in an integrated circuit. Extended port regions are created for the ports of the net of the integrated circuit, the extended port regions being shaped in such a way as to guarantee routing access to the ports. A wire corresponding to the net is then placed and the extended port regions of the ports are trimmed, thus identifying essential port regions required for connecting the wire to the ports and dispensable port regions not required for connecting the wire to the ports. The wiring resources are then updated by releasing the dispensable port regions so that the dispensable port regions no longer constitute parts of the ports.

12 Claims, 9 Drawing Sheets

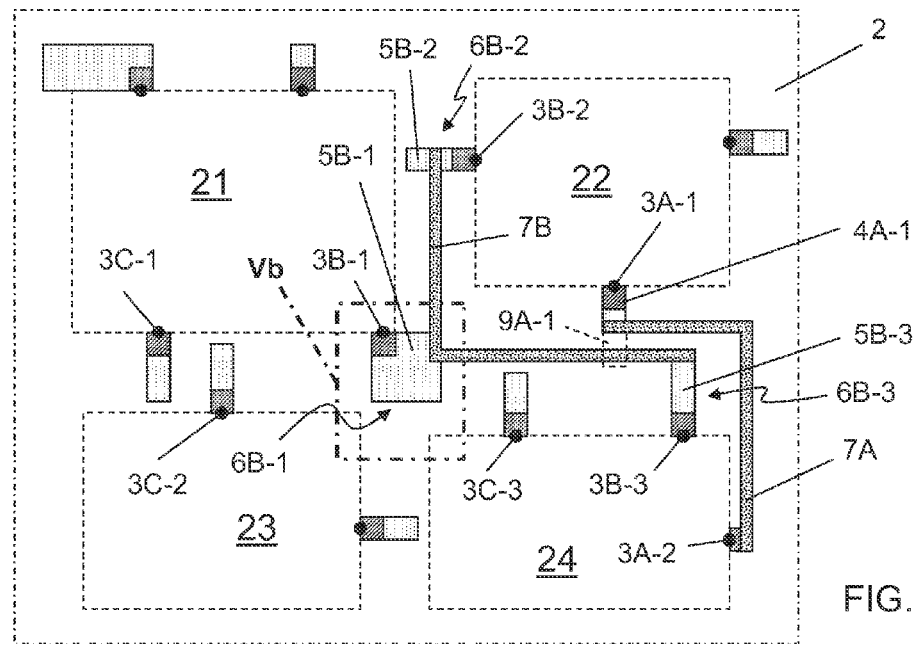
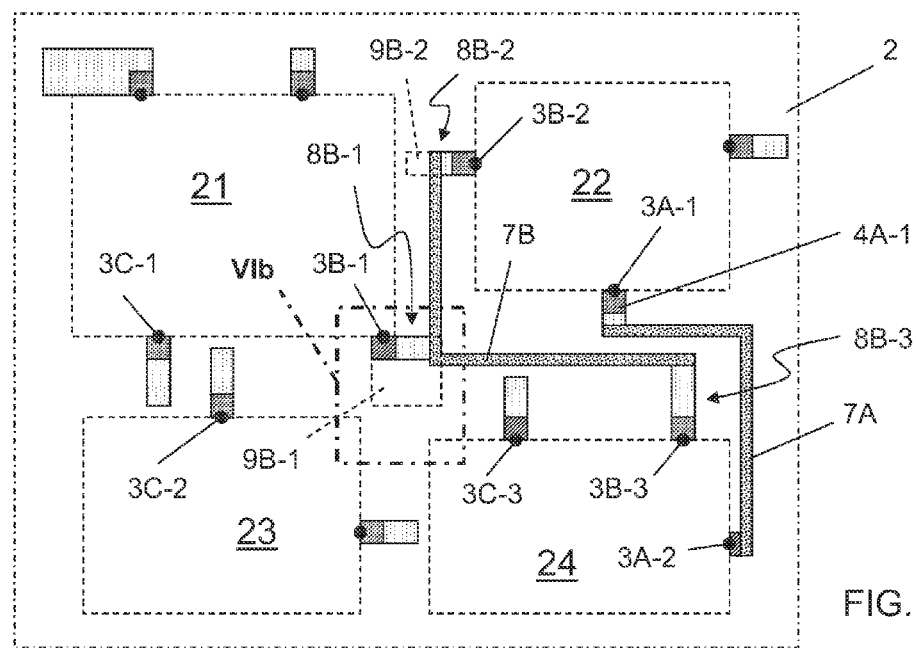

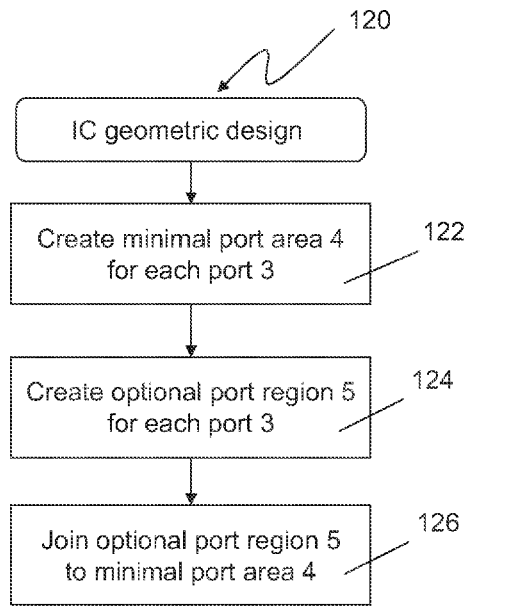
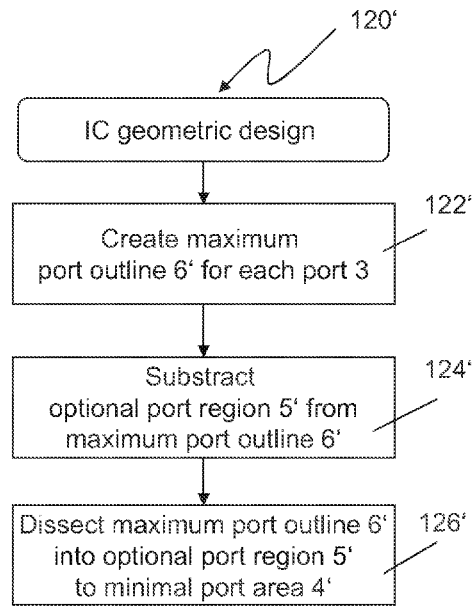
FIG. 3a  FIG. 3b
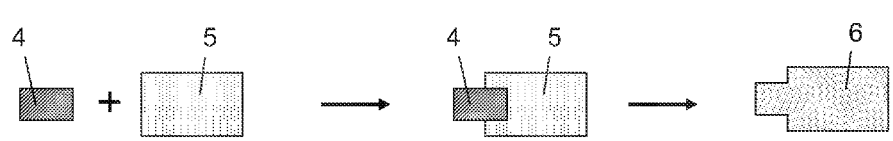
FIG. 4a
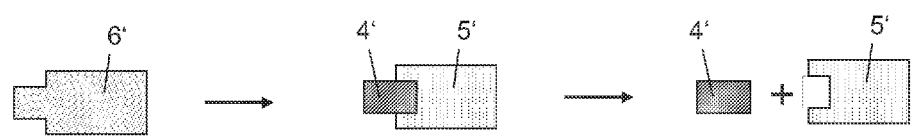
FIG. 4b

SHAPING PORTS IN INTEGRATED CIRCUIT DESIGN

BACKGROUND

The invention relates generally to the design of semiconductor integrated circuits (ICs). More specifically, the invention relates to a method for designing and adapting port shapes in such a way as to optimize resources during detailed routing.

An integrated circuit (IC) is a device which includes a plurality of electronic components, e.g. transistors, resistors, diodes etc.). These components are interconnected to form multiple circuit components (gates, cells, memory units etc.) on the IC. Interconnects between the components are formed by stripes of metal wiring arranged in planar layers (so-called "metal layers" M1, M2, M3, . . . ) within the IC. Up to ten (or even more) of these metal layers may be stacked on top of each other.

During IC design, a circuit description of the IC—characterizing the IC's properties—is transformed into a geometric description (so-called layout) by using geometric shapes that represent different materials and devices on the IC. For example, wire segments interconnecting the IC's components are commonly represented by rectangular lines, whereas the IC components themselves are commonly represented as geometric objects of varying shapes and sizes. The circuit modules (corresponding to the geometric representations of the IC's circuit components) are typically illustrated with ports on their sides or within the component; these ports are used to interconnect the IC component to power supply and other IC components within the design. A net is typically defined as a collection of ports that need to be electrically connected. The list of all or some of the nets in the layout is referred to as a netlist. Thus, the netlist specifies a group of nets, which, in turn, specify the required interconnections between a set of ports.

As part of IC design, in a so-called placement step, circuit modules are placed on the various metal layers, thus determining the alignment, orientation and position of the circuit modules on the chip. Subsequently, a routing step is carried out in which the circuit modules are interconnected. Routing is generally carried out in three phases. Global routing generates a "coarse" route for the interconnect lines that are to connect the ports of the net. After global routes have been created, local routing creates specific individual routing paths for each net. Based on these routing paths, final port accesses are created in a detailed routing step.

U.S. Pat. No. 7,032,201 B1 discloses a detailed routing method for a region of an IC layout which contains a plurality of routable elements such as port areas which are to be connected by a net. The method makes use of a decomposition in terms of a plurality of nodes located in the region; some of the nodes are located at a boundary of the routable elements. Based on these nodes, the region is triangulated, and the triangles thus defined are used for generating routes in the region under consideration. By iteratively dividing the region into smaller and smaller triangles, a fine-grained route can be determined. Triangulation may also be performed on the port geometries.

While the decomposition described in U.S. Pat. No. 7,032,201 B1 can be used as a basis for detailed routing, this provides only a topological route, i.e. a general plan for how to route a net in the region under consideration. Method of U.S. Pat. No. 7,032,201 B1 generally does not provide a specific geometric path to implement this topological route and therefore does not furnish means of extracting or influencing the geometrical properties (shape, size etc.) of the routable elements.

When geometrical properties (boundary, size etc.) of ports are defined during detailed routing, the ports are typically assigned shapes in such a way that routing access is possible under all circumstances. As a consequence, the areas of these ports are generally defined larger than actually needed. The excess area assigned to these ports constricts the free space resources available for wiring of other ports. Since routing resources are limited, this impedes detailed routing and may cause wiring congestion.

BRIEF SUMMARY

In one illustrative embodiment, a method, in a data processing system, is provided for performing a detailed routing of a net joining ports in an integrated circuit. The illustrative embodiment creates extended port regions for ports of a net of an integrated circuit, the extended port regions being shaped in such a way as to guarantee routing access to the ports. The illustrative embodiment places a wire corresponding to the net and then trims the extended port regions of the ports, thus identifying essential port regions required for connecting the wire to the ports and dispensable port regions not required for connecting the wire to the ports. The illustrative embodiment then updates wiring resources by releasing the dispensable port regions so that the dispensable port regions no longer constitute parts of the ports.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a data processing system is provided. The data processing system may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The present invention together with the above-mentioned and other objects and advantages may best be understood from the following detailed description of the embodiments, but not restricted so the embodiments, wherein is shown in:

FIG. 1e shows the design of FIG. 1d after wiring of a second net connecting a second set of ports in accordance with an illustrative embodiment;

FIG. 1f shows the design of FIG. 1e after trimming the port areas of the second net to essential port regions necessary for connecting the wiring to the second set of ports in accordance with an illustrative embodiment;

FIG. 3a shows a flow diagram of a method of creating an extended port by summation of a minimal port area and an optional port area in accordance with an illustrative embodiment;

FIG. 3b shows a flow diagram of a method of creating a minimal port area by subtraction of an optional port area from a maximum port outline in accordance with an illustrative embodiment;

FIG. 4a shows a schematic representation of the method of FIG. 3a in accordance with an illustrative embodiment;

FIG. 4b shows a schematic representation of the method of FIG. 3b in accordance with an illustrative embodiment;

Figure 1A:
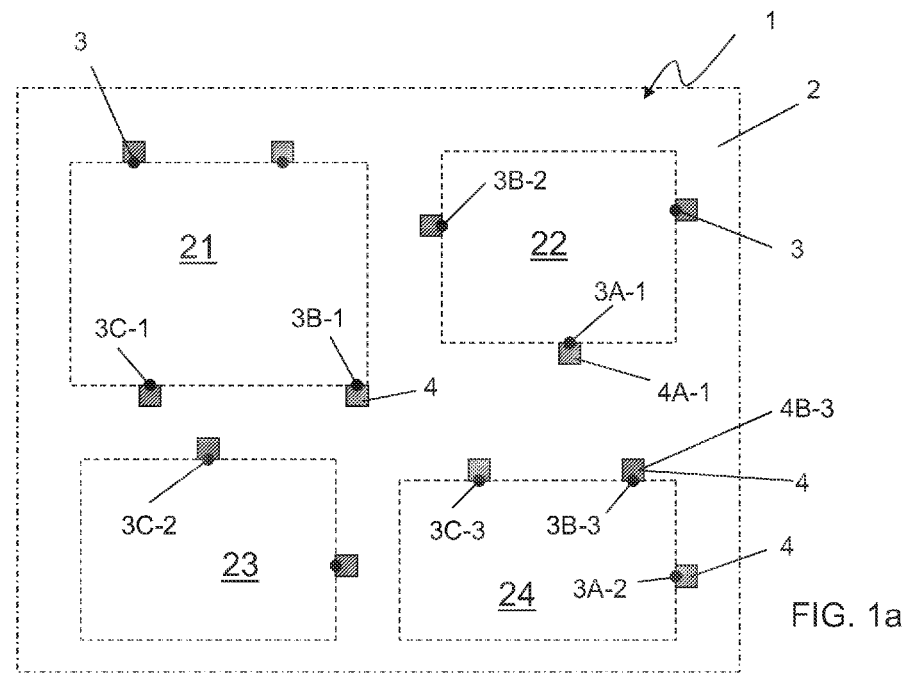
FIG. 1a shows a schematic layout representation of an integrated circuit design with a set of ports which have been assigned minimal port areas required for ensuring functionality and/or reliability of the circuit in accordance with an illustrative embodiment.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION

FIG. 1a shows a geometric description of an integrated circuit design 1 to be fitted onto a chip surface 2 in accordance with an illustrative embodiment. This geometric description corresponds to a design stage after completion of placement. Four circuit modules 21-24 (representing geometric representations of the corresponding IC circuit components) have been placed on chip surface 2. Each of the circuit modules 21-24 comprises a set of ports 3 indicated by bullets in FIG. 1a. The ports 3 are used to interconnect the circuit modules 21-24 to each other, thus forming nets A, B and C reflecting the IC's logic: Ports 3A-1 and 3A-2 form net A, ports 3B-1, 3B-2 and 3B-3 form net B and ports 3C-1, 3C-2 and 3C-3 form net C.

In the geometric description of FIG. 1a, each port 3 has been assigned a minimal port area 4; this minimal port area 4 is physically required in order to enable metal stripes (corresponding to the physical implementation of the nets) to make electrical connections to the respective port and thus achieve the functionality of the circuit. The minimal port area 4 may comprise one or multiple disjoint regions acting as connection targets; this supports state of the art port models with strong, mast or weak connect. Note also that while the minimal port areas 4 of all ports 3 in FIG. 1a are drawn to be the same size and to have a rectangular shape, this need not be so; in general, the minimal port areas 4 of the ports 3 may have any sizes and shapes (depending on functionality and layout of the design).

During routing of the design, metal wiring stripes are placed on the chip surface 2 so as to implement electrical connections between the ports. When doing so, general routing rules are applied such as, for example, rules that force wiring to a rectangular (Manhattan) grid, rules imposing penalties for utilizing vias to other metal layers etc. For reasons of simplicity, it is assumed that chip surface 2 has only one metal layer, so that all wiring has to be fitted into the area shown in FIG. 1a. When routing the design of FIG. 1a, circuit modules 21-24 constitute obstacles in the sense that the chip areas occupied by them are unavailable for placing interconnects; by the same token, minimal port areas 4 of ports 3 of a given net constitute obstacles for wiring of other nets.

The minimal port areas 4 assigned to each port 3 are generally not sufficient to allow routing access under all circumstances; thus, ports areas need to be enlarged in order to enable successful routing. However, while increasing the port area of a given port augments routing accessibility of this port, large port areas form obstacles to other nets and thus may reduce accessibility of other ports. Moreover, any chip area reserved for an enlarged port reduces the free space available for putting wiring, thus limiting routing resources and increasing the danger of wiring congestion.

Figure 1B:
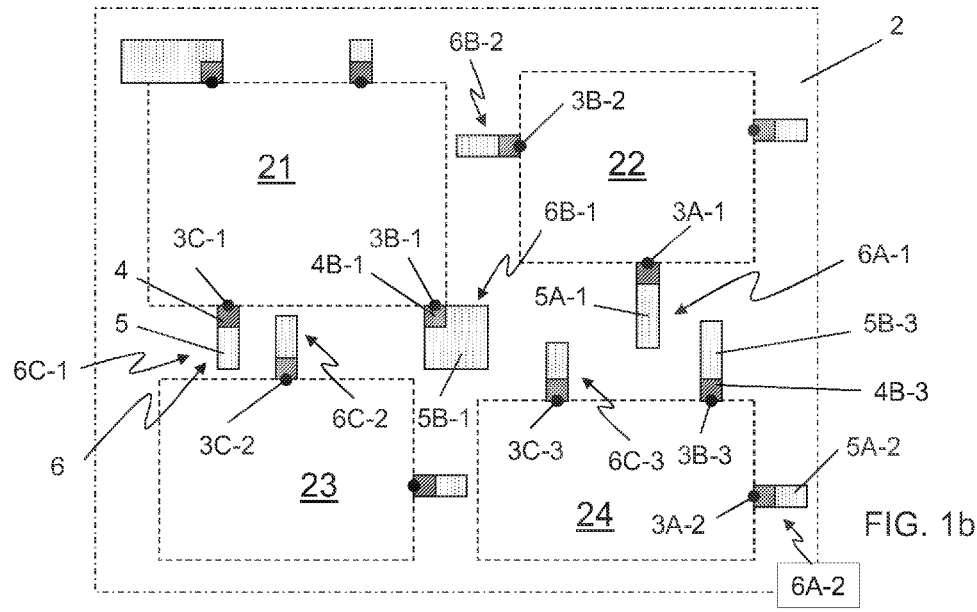
FIG. 1b shows the design of FIG. 1a in which the ports have been assigned extended port areas composed of minimal and optional port areas and dimensioned in such a way as to ensure routing access to the ports in accordance with an illustrative embodiment.
Figure 1C:
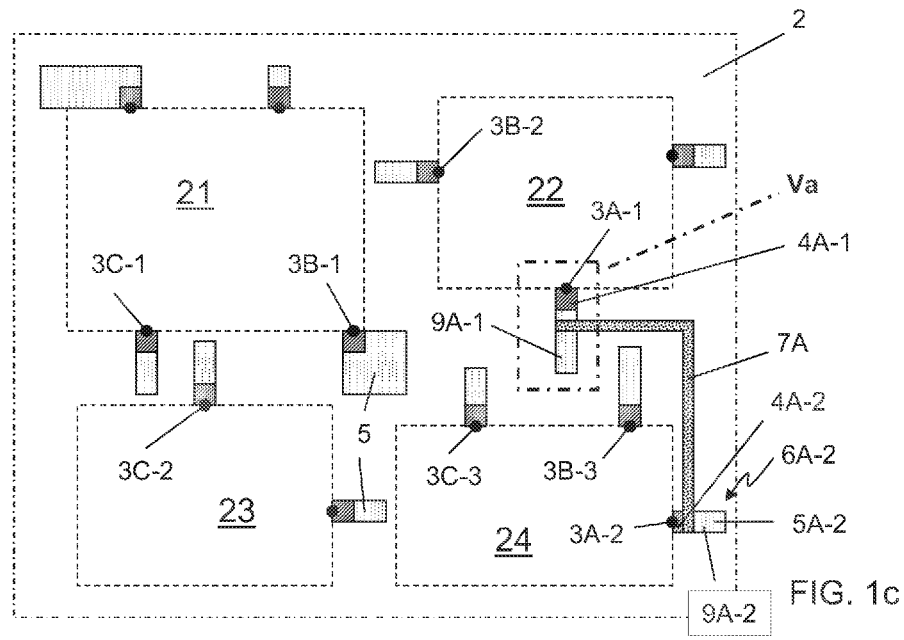
FIG. 1c shows the design of FIG. 1b after wiring of a first net connecting a first set of ports in accordance with an illustrative embodiment.
Figure 1D:
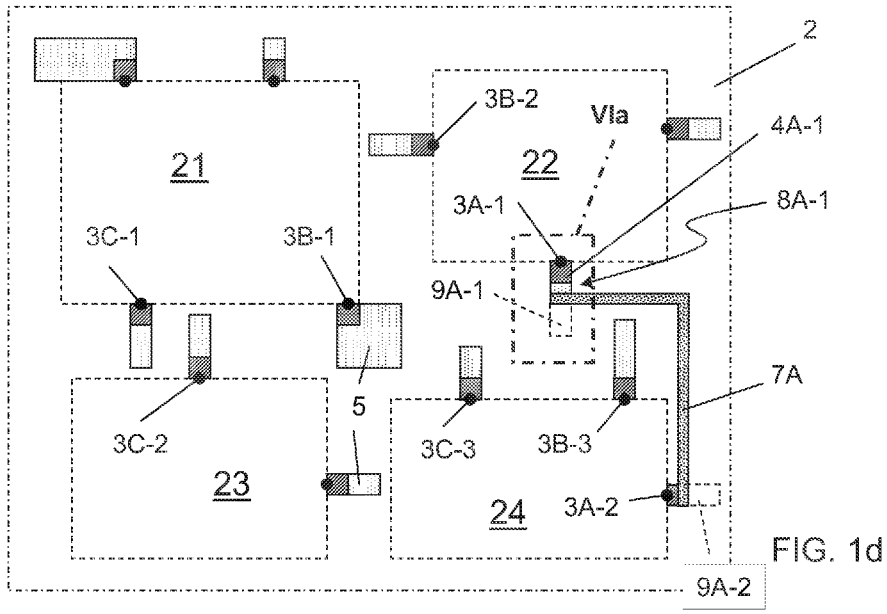
FIG. 1d shows the design of FIG. 1c after trimming the port areas of the first net to essential port regions necessary for connecting the wiring to the first set of ports in accordance with an illustrative embodiment.
Figure 1G:
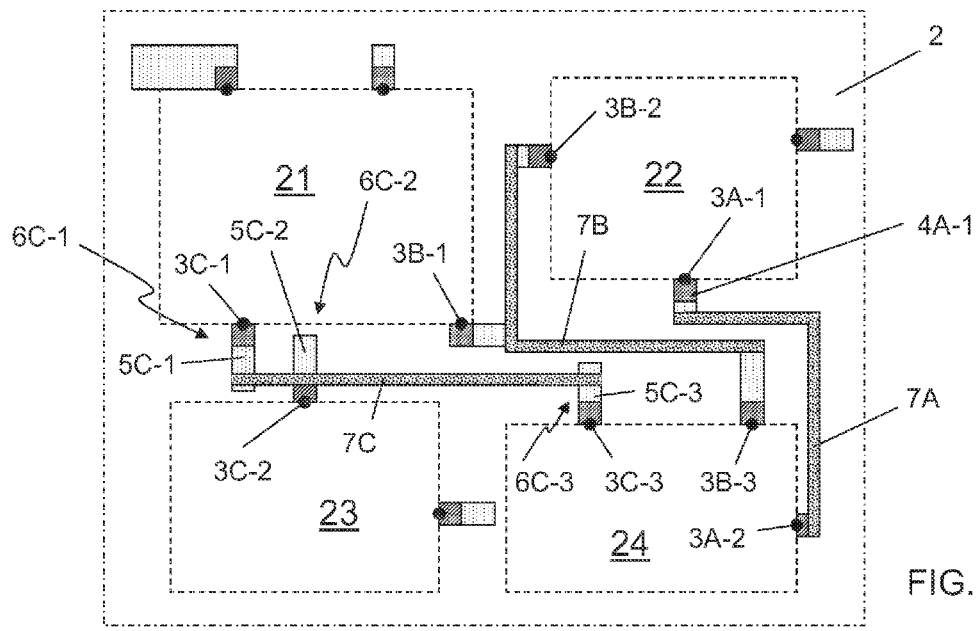
FIG. 1g shows the design of FIG. 1f after wiring of a third net connecting a third set of ports in accordance with an illustrative embodiment.
Figure 2A:
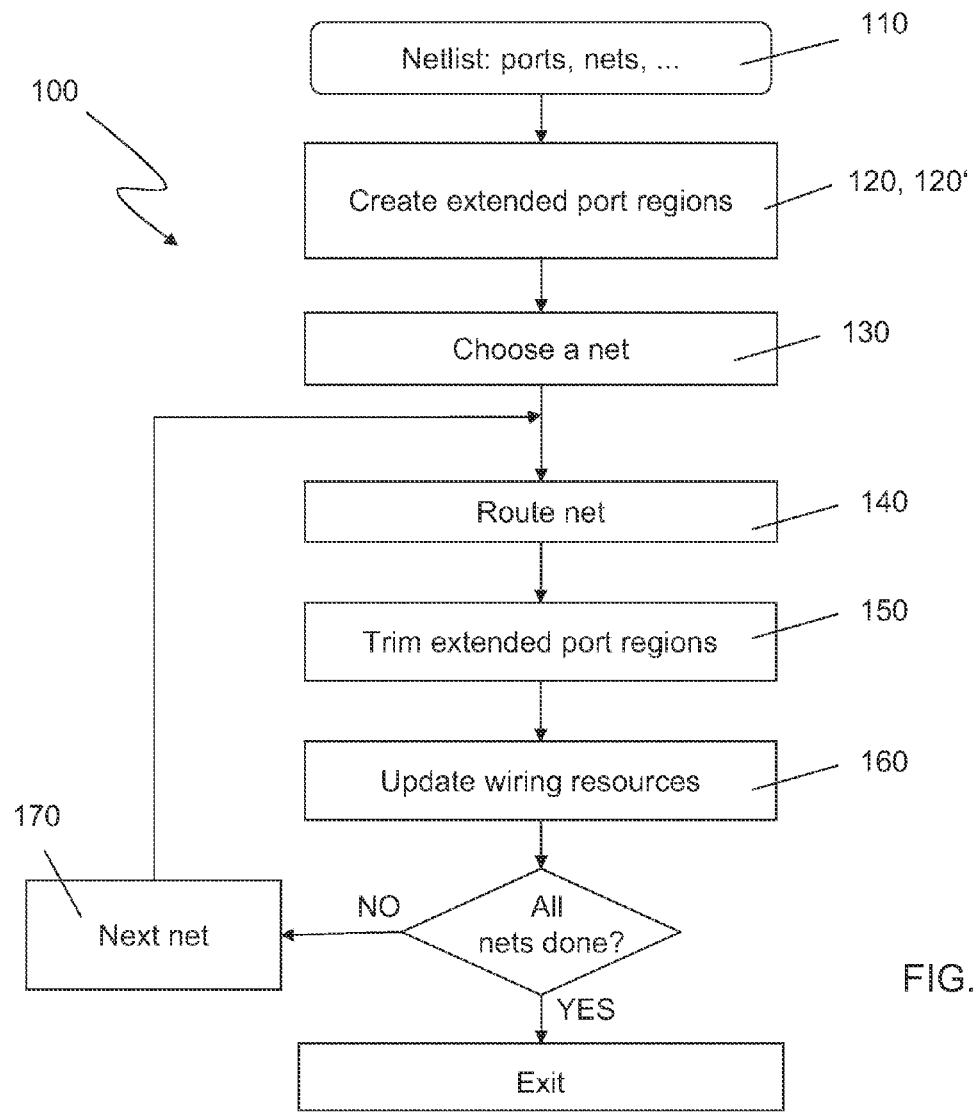
FIG. 2a shows a flow diagram of a method for routing an integrated circuit design in such a way that routing access of all ports in the design can be achieved while keeping port areas small in accordance with an illustrative embodiment.

FIG. 2a shows a schematic flow diagram of a preferred embodiment of a method 100 for shaping port regions in such a way that routing access of all ports in the circuit can be achieved while keeping port areas small in accordance with an illustrative embodiment. Method 100 optimizes port area by creating so-called extended port regions which are sized and shaped in such a way as to guarantee routing access under all circumstances (step 120);

routing the nets one by one (step 140—see FIGS. 1c, 1e and 1g);

after routing a specific net, cutting back the extended port areas of ports pertaining to this net (step 150—see FIGS. 1d, 1f and 1h), thus opening resources for other nets.

Method 100 sets out with a geometrical model of integrated circuit design 1 after placement of circuit modules on chip surface 2, as well as a design definition, e.g. in terms of a netlist (step 110). Based on this geometrical model, extended port regions 6 as is shown in FIG. 1b are generated for each of the ports 3 in step 120 in accordance with an illustrative embodiment.

FIG. 3a shows a detailed flow diagram of a preferred embodiment of this port creation step 120, using a data model which is based on a summation of regions, as shown schematically in FIG. 4a in accordance with an illustrative embodiment. Port creation step 120 encompasses determining minimal port areas 4 for all ports 3 (step 122) wherein the minimal port areas 4 are defined such that they consume minimal resources while enabling the functionality of the circuit;

enlarging the minimal port areas 4 by adding optional port regions 5 to them (step 124), wherein the optional port regions 5 are shaped and dimensioned in such a way that they will ensure routing access to the respective port 3 under all circumstances.

In step 122, locations and shapes of minimal port area 4 of all ports 3 of the design (or the subset of the design) to be routed are determined; these minimal port area 4 (see FIG. 1a) are constructed in such a way that they have minimal geometric area while ensuring functionality of the circuit to be routed. Subsequently (step 124), optional port regions 5 are added to the minimal port areas 4 (see FIG. 1b). These optional port regions 5 represent additional access zones. They increase the number of ways in which wiring can be connected to the respective port 3 and are designed in such a way as to guarantee routing access to port 3 under all circumstances. By joining a port's 3 optional port region (s) 5 to this port's 3 minimal port area 4 (step 126), an extended port region 6 of this port 3 is formed. This is illustrated in the schematic diagram of FIG. 4a, which shows that in this so-called "summation model" the optional port regions 5 are allowed to intersect the minimal port areas 4.

FIG. 1b shows the integrated circuit design 1 of FIG. 1a after assigning an extended port region 6 (comprising a minimal port area 4 and an optional port region 5) to each port 3 in accordance with an illustrative embodiment. Note that the sizes and geometries of the extended port regions 6 will generally vary from port to port. In the embodiment of FIG. 1b, extended port region 6B-1 of port 3B-1 located at a corner of circuit module 21 is larger than the extended port region 6C-1 of port 3C-1 located between corners. Also note that extended port regions 6 need not be rectangular but may have any shape and may extend to other access layers (M1, V1, M2, V2, . . . ).

As part of port creation step 120, the physical data model of each port 3 of the design will be enhanced by a list of port regions. A flag assigned to each port region classifies the respective port region as mandatory (i.e. as a minimal port area 4) or as optional (i.e. as an optional port region 5) in a specific instance of integrated circuit design 1. In addition, the port's data structure contains physical information on the respective port regions (such as layer, purpose, location, shape).

Having thus created extended port regions 6 made up of minimal port regions 4 and optional port regions 5, detailed routing is carried out successively for the various nets of the design. During each of these routing steps, a specific net is chosen (step 130) and routed (step 140). After completion of the routing of this specific net, the extended port regions 6 pertaining to the ports of this net are trimmed by cutting off all parts which are not immediately required for ensuring functionality of the net (step 150). In this way, non-essential port areas are snipped off, thus releasing wiring resources for nets yet to be routed. These routing-and-trimming steps are implemented to all nets of the design, one after the other (loop 170).

Figure 5A:
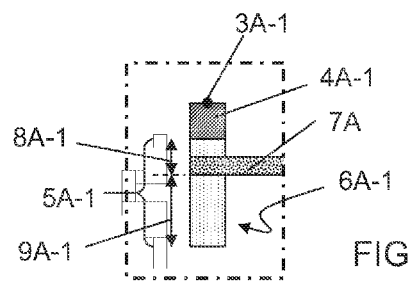
FIG. 5a shows an enlarged view of detail Va of FIG. 1c in accordance with an illustrative embodiment.

In the example of FIG. 1b, assume that net A is routed first (step 130) by placing a wire 7A so connect port 3A-1 to port 3A-2 (step 140) (see FIG. 1c in accordance with an illustrative embodiment). Note that the extended port regions 6 of all ports 3 are constructed in such a way that wires connecting this port 3 to other ports of the respective net will always fully overlap with extended port region 6. As to port 3A-1, which is shown in detail in FIG. 5a in accordance with an illustrative embodiment, wire 7A is seen to overlap with its optional port region 5A-1 and to dissect optional port region 5A-1 into two portions, an essential port region 8A-1 and a dispensable port region 9A-1 (see FIG. 2c in accordance with an illustrative embodiment).

Essential port region 8A-1 comprises the overlap region of wire 7A and extends to the edge of minimal port area 4A-1 of port 3A-1. Essential port region 8A-1 thus joins wire 7A to minimal port area 4A-1 and is required for forming a connection between wire 7A and port 3A-1; it must not be snipped off.

On the other hand, dispensable port region 9A-1 extends between the overlap region of wire 7A and the far end of optional port region 5A-1. It is not necessary for connecting port 3A-1 to net A and thus can be trimmed off (step 150) without any detrimental effect on the design's functionality.

Figure 2B:
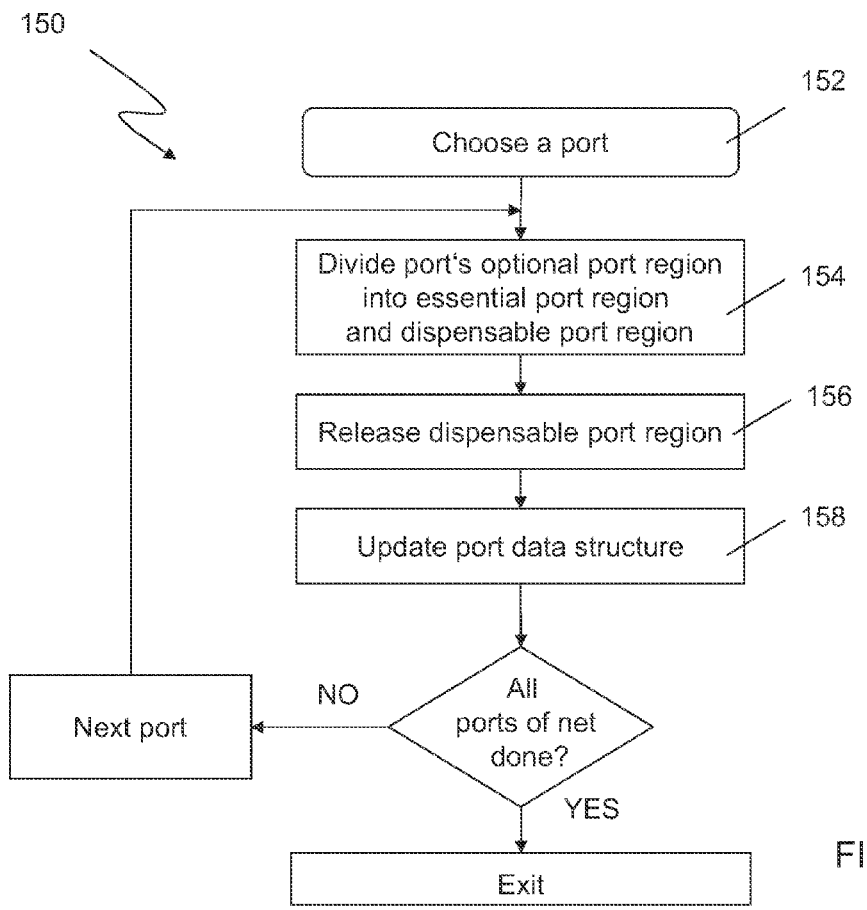
FIG. 2b shows a flow diagram of a method shaping a port in an integrated circuit design in such a way that routing access can be guaranteed while keeping port areas small in accordance with an illustrative embodiment.
Figure 6A:
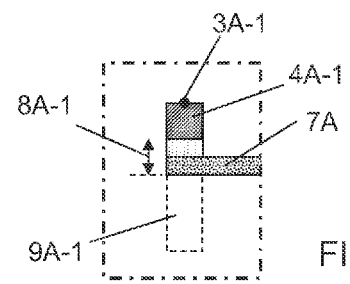
FIG. 6a shows the view of FIG. 5a after trimming of port area, corresponding to detail VIa of FIG. 1d in accordance with an illustrative embodiment.

Thus, as shown in the detailed flow diagram of trimming step 150 (FIG. 2b in accordance with an illustrative embodiment), optional port region 5A-1 is divided into essential port region 8A-1 and dispensable port region 9A-1 (step 154), where dispensable port region 9A-1 may consist of multiple disjoint parts. Dispensable port region 9A-1 is released from optional port region 5A-1 (step 156). The result is shown in FIG. 6a in accordance with an illustrative embodiment. By releasing dispensable port region 9A-1, the corresponding chip area (indicated by dashed lines) is made available for wiring of other nets. Moreover, overall capacitance of net A is reduced by snipping off the excess wiring corresponding to dispensable port region 9A-1. Having thus determined the essential port region 8A-1 of port 3A-1, the corresponding physical data model of port 3A-1 is updated (step 158) by setting the flag assigned to the used piece of optional port region 5A-1 to state "used", and by storing the geometric data (shape, location) pertaining no essential port region 8A-1 as part of this port's physical information.

As to port 3A-2 of net A, wire 7A is seen to overlap extended port region 6A-2 assigned to port 3A-2 in such a way that it is fully contained in minimal port area 4A-2. Thus, optional port region 5A-2 is not required for connecting wire 7A to port 3A-1; it therefore forms a dispensable port region 9A-2 and can be snipped off. Accordingly, the physical data model of port 3A-2 is adjusted by setting the flag of optional port region 5A-2 to state "unused".

Figure 2C:
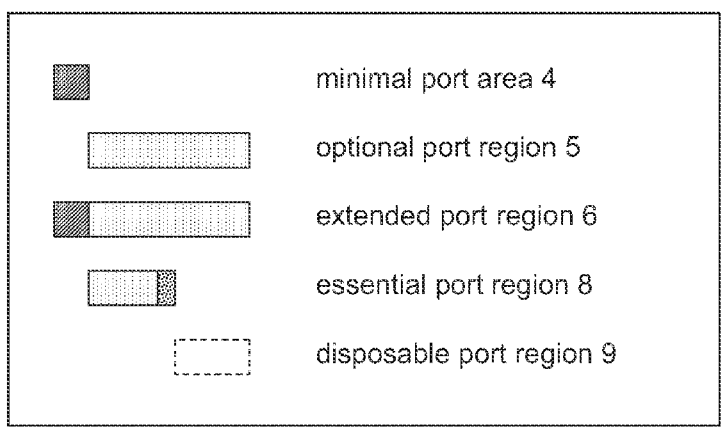
FIG. 2c shows a schematic diagram illustrating the various port regions in accordance with an illustrative embodiment.

FIG. 2c shows a schematic diagram of the various port regions (minimal port region 4, optional port region 5, extended port region 6, essential port region 8 and disposable port region 9) in accordance with an illustrative embodiment.

Having trimmed all optional port regions 5A of ports 3A in net A by cutting off dispensable port regions 9A-1 and 9A-2, the wiring resources of the router are updated accordingly (step 160), so that spaces originally occupied by dispensable port regions 9A are now available for subsequent routing of nets B and C. A view of chip 1 after executing this update is shown in FIG. 1*d* in accordance with an illustrative embodiment.

Assume that net B is routed next (step 170). Hiring 7B is placed to connect ports 3B-1, 3B-2 and 3B-3 (step 140), as shown in FIG. 1*e* in accordance with an illustrative embodiment. Note that wire 71B traverses dispensable port region 9A-1 of port 3A-1 which was released in the preceding step of trimming port regions pertaining to net A; thus, the cutback of extended port region 6A-1 of port 3A-1 as described above has the immediate effect of furnishing additional routing resources for net B. After routing net B in step 140, excess portions of optional port regions 5B of ports 3B belonging to net B are trimmed off in step 150.

Figure 5B:
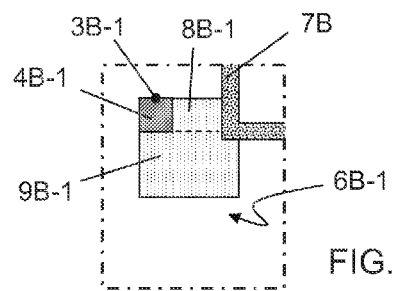
FIG. 5b shows an enlarged view of detail Vb of FIG. 1e in accordance with an illustrative embodiment.
Figure 6B:
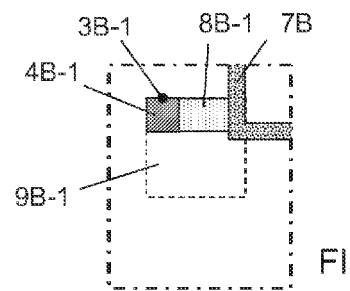
FIG. 6b shows the view of FIG. 5b after trimming of port area, corresponding to detail VIb of FIG. 1f in accordance with an illustrative embodiment.

As to port 3B-3, the entire optional port region 5B-3 is necessary for joining wire 7B to minimal port area 4B-3 so that optional port region 5B-3 cannot be trimmed; thus, essential port region 8B-3 of port 3B-3 is identical to optional port region 5B-3. As to port 3B-1 of net B, only a small fraction of optional port region 5B-1 is required for joining wire 7B to minimal port area 4B-1, so that a large dispensable port region 9B-1 may be trimmed off without jeopardizing functionality of net B; this is shown in the detailed views of FIGS. 5*b* and 6*b* in accordance with an illustrative embodiment. By releasing dispensable port region 9B-1, the corresponding chip area is made available for routing of additional nets. As to port 3B-2, extended port region 6B-2 is trimmed accordingly, following the rules outlined above.

Corresponding to the trimming of the optional port regions 5B of ports 3B of net B, the physical data models of ports 5B are updated by setting the flags of optional port region 5B to state "used" or "unused" and by storing the geometric data (shape, location) pertaining to essential region 8B as part of this ports' 3B physical information. The result of trimming and updating steps 150, 160 as performed on the port regions of net B is shown in FIG. 1*f* in accordance with an illustrative embodiment. Besides freeing resources for other nets and reducing the capacitance of net B, the trimming has the positive effect of relaxing net to net spacing at the ports, resulting in a reduction of coupling between nets and reduction of short circuits between neighboring nets A and B.

Figure 1H:
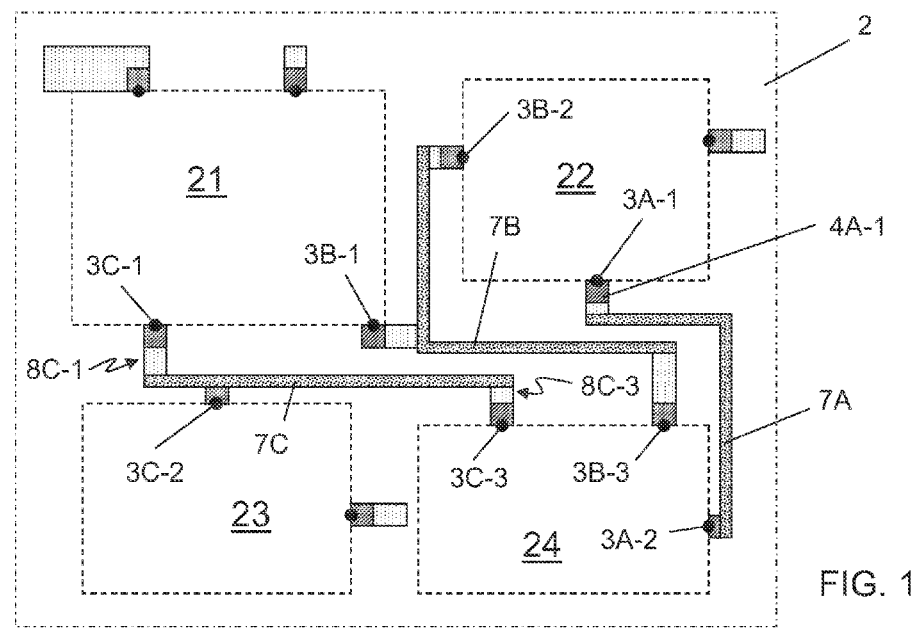
FIG. 1h shows the design of FIG. 1g after trimming the port areas of the third net to essential port regions necessary for connecting the wiring to the third set of ports in accordance with an illustrative embodiment.

Finally, net C is routed (step 140) by placing a wire 7C to connect ports 3C-1, 3C-2 and 3C-3 (see FIG. 1*g* in accordance with an illustrative embodiment), and dispensable port regions of ports in net C are trimmed off (step 150) to yield the layout 1' of FIG. 1*h* in accordance with an illustrative embodiment.

Note that if completed nets were to be removed (ripped out) during the detailed routing process, this encompasses—aside from removing the wiring 7 pertaining to this net—reestablishing the wiring resources of each port of this net by marking all optional port regions as "used" in the ports' data structures and by restoring the optional port regions to their original size and shape.

Figure 7:
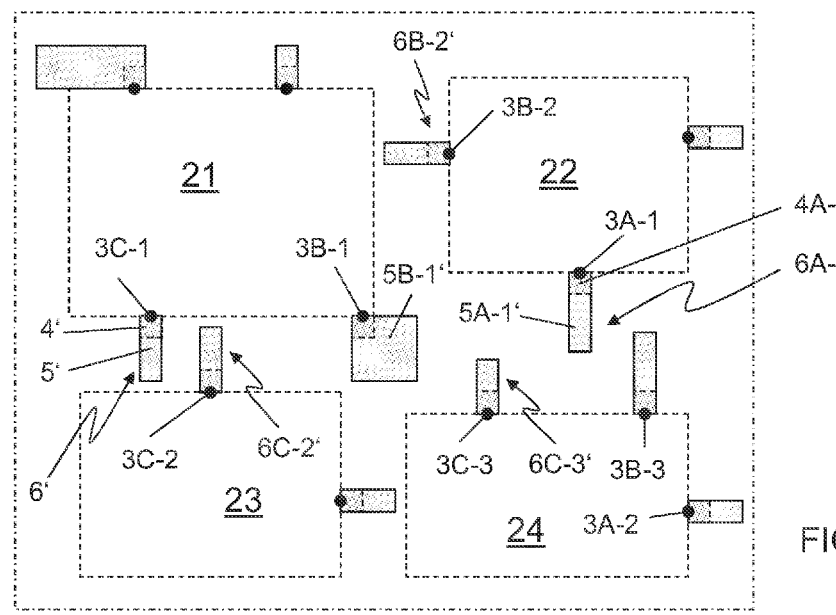
FIG. 7 shows the design of FIG. 1b with the ports exhibiting extended port areas before dividing extended port areas into minimal and optional port areas in accordance with an illustrative embodiment.

As described in conjunction with the illustrative embodiment of FIG. 3*a*, step 120 of constructing port shapes may be based on a summation of port regions as illustrated in FIG. 4*a* in accordance with an illustrative embodiment. Alternatively, port shapes can be defined by a subtraction of regions. This is outlined in the flow diagram of in FIG. 3*b* and illustrated in FIG. 4*b* in accordance with an illustrative embodiment. Here, the port is originally defined as the maximum port outline 6' required for guaranteeing routing access under all circumstances; these maximum port outlines 6' corresponding to the ports 3 of FIG. 1*a* are depicted in FIG. 7 (and correspond to the extended port regions 6 as constructed by the summation approach of FIG. 3*a*) in accordance with an illustrative embodiment. Based this definition of maximum port outlines 6', an optional port region 5' is defined as the region that could be subtracted from this maximum port outline 6' without jeopardizing functionality and/or reliability of the respective design. The remainder of the maximum port outline 6'—after all optional port regions have been subtracted off—is defined to be the minimal (required) port area 4' (see FIG. 4*b*). Note that in this case—as opposed to the summation model illustrated in FIG. 4*a*—optional port regions 5' must not intersect minimal port areas 4'.

In this case, the physical data model of port comprises a list of minimal port areas 4' as well as a list of optional port regions 5'. Essential port regions are defined by a parent port pointer as well as physical information on the respective metal layer, purpose, shape, location. Analogously, dispensable port regions are defined by a parent port pointer, physical information on the respective metal layer, purpose, shape, location as well as a flag indicating whether this dispensable port region is "used" in the specific circuit instance (corresponding to port shape before trimming step 150) or "unused" (corresponding to port shape after trimming step 150).

Figure 8:
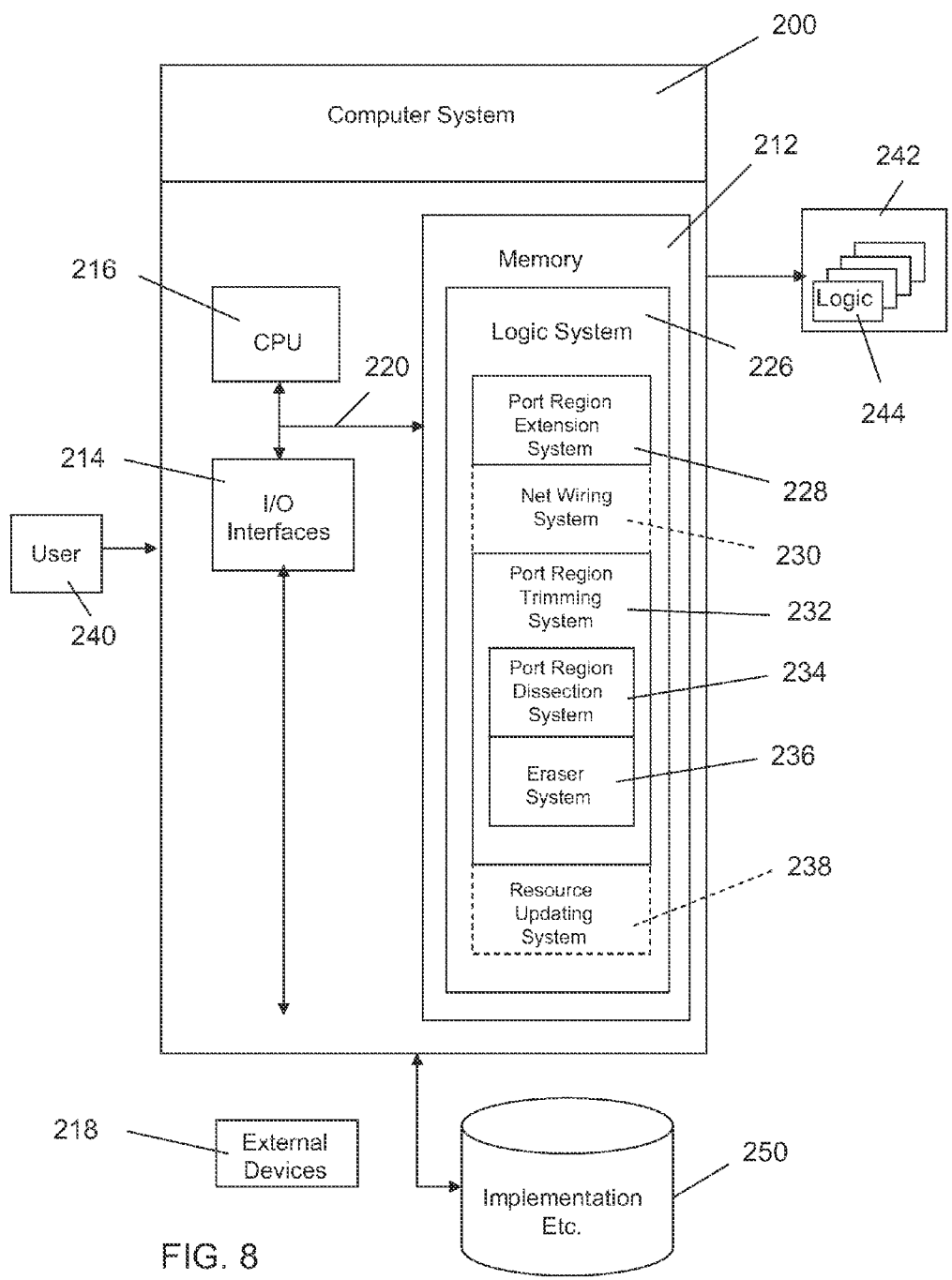
FIG. 8 shows a computer system implementation of a preferred method for shaping ports and routing ports in an IC design in accordance with an illustrative embodiment.

Referring now to FIG. 8, a computer system 200 implementation of a preferred embodiment of the present invention is shown in accordance with an illustrative embodiment. Specifically, the present invention can be implemented as a computer system 200 and/or program product for shaping a port 3 in an integrated circuit design 1 and/or performing a detailed routing of a net A joining ports 3A in an integrated circuit design 1. This allows a user 240, for example a circuit designer, to shape ports in such a way that routing resources are enhanced while guaranteeing routing access under all circumstances.

As depicted, computer system 200 generally comprises memory 212, input/output (I/O) interfaces 214, a central processing unit (CPU) 216, external devices/resources 218, bus 220 and data base 250. Memory 212 may comprise any known type of data storage and/or transmission media, including magnetic media, optical media, random access memory (RAM), read-only memory (ROM), a data cache, a data object etc. Moreover, memory 212 may reside at a single physical location, comprising one or more types of data storage, or can be distributed across a plurality of physical systems in various forms. CPU 216 may likewise comprise a single processing unit, or be distributed across one or more processing units in one or more locations, e.g. on a client and server. I/O interfaces 214 may comprise any system for exchanging information from an external source. External devices 218 may comprise any known type of external device, including keyboard, mouse, voice recognition system, printer, monitor, facsimile etc. Bus 220 provides a communication link between each of the components in the computer system 200 and likewise may comprise any known type of transmission link, including electrical, optical, wireless etc. In addition, although not shown, additional components such as cache memory, communication systems, system software etc. may be incorporated into computer system 200.

Database 250 provides storage for information necessary to carry out the present invention. Such information could include e.g. a netlist of the IC design, geometrical layout information, congestion data etc. Database 250 may include one or more storage devices, such as a magnetic disk drive, or an optical, disk drive. In another embodiment, database 250 includes data distributed across, for example, a local area network (LAN), wide are network (WAN) or a storage area network (SAN). Database 250 may also be configured in such a way that one of ordinary skill in the art may interpret it to include one or more storage devices. Moreover, it should be understood that database 250 could alternatively exist within computer system 200.

Stored in memory 212 is logic system 226. As depicted, logic system 226 generally includes a Port Region Extension System 228 and a Port Region Trimming System 232. Port Region Trimming System 232 comprises Port Region Dissection System 234 and Eraser System 236. Moreover, logic system 226 may include a Net Wiring System 230 and a Resource Updating System 238. The systems shown herein carry out the functions described above:

Port Region Extension System 228 is used for creating an extended port region 6 of a port 3, which is made up of a minimal port area 4 (corresponding to the minimally required area for enabling functionality of the circuit) and an optional port region 5 (shaped in such a way as to guarantee routing access to said port 3).

Net Wiring System 230 is used for connecting the port 3 to its corresponding net A by placing a wire 7A overlapping the extended port region 6 of port 3.

Port Region Trimming System 232 is used for trimming the extended port regions by identifying and snipping off any dispensable port regions 9 of port 3.

Port Region Dissection System 234 is used for dividing an optional port region 5 into an essential region 8 (required for connecting the minimal port region 4 to wiring 7 of the corresponding net) and a dispensable region 9.

Eraser System 236 is used for releasing the port's dispensable region 9 so that it no longer constitutes part of this port.

Resource Updating System is used for updating wiring resources by releasing dispensable port regions 9.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code which must be retrieved from bulk storage during execution.

Input/output or I/O-devices (including, but not limited to keyboards, displays, pointing devices, etc.) can be coupled to the system either directly or through intervening I/O controllers.

Network adapters may also be coupled to toe system to enable the data processing system or remote printers or storage devices through intervening private or public networks. Modems, cable modem and Ethernet cards are just a few of the currently available types of network adapters.

The invention claimed is:

1. A method thr performing a detailed routing of a net joining a set of ports in an integrated circuit, the method comprising:
    creating, by a processor, extended port regions for each port in the set of ports of the integrated circuit, the extended port regions being shaped in such a way as to guarantee routing access to the ports, wherein each port in the set of ports is coupled to a circuit module in a set of circuit modules in the integrated circuit such that each circuit module comprises one or more ports, wherein each of the extended port regions to each port comprise a minimal port area and an optional port region, wherein the minimal port area is a minimally required area for enabling connectivity of the circuit module and the optional port region is shaped so as to guarantee routing access to the port, and wherein the optional port region expands both in length and width beyond the minimal port area;
    placing, by the processor, a wire corresponding to the net;
    trimming, by the processor, the extended port regions of the ports, thus identifying essential port regions required for connecting the wire to the ports and dispensable port regions not required for connecting the wire to the ports wherein trimming each of the extended port regions of each of the ports further comprises:
        dividing, by the processor, the optional port region into an essential port region required for connecting the minimal port region to the wire of the net and a dispensable port region that is not required for connecting the minimal port region to wiring of the net; and
        releasing, by the processor, the dispensable port region so that the dispensable port region no longer constitutes part of the port, wherein the dispensable port region is reduced in at least one of length or width; and
    updating, by the processor, wiring resources by releasing the dispensable port regions so that the dispensable port regions no longer constitute parts of the ports.

2. The method of claim 1, wherein creating the extended port region for the port further comprises:
    creating, by the processor, the minimal port area required for enabling at least one of functionality or reliability of the integrated circuit;
    creating, by the processor, the optional port region shaped in such a way as to guarantee routing access to the port; and
    joining, by the processor, the minimal port area to the optional port region to form the extended port region.

3. The method of claim 1, wherein creating the extended port region for the port further comprises:
    defining, by the processor, the extended pot region shaped in such a way as to guarantee routing access to the port;
    subtracting, by the processor, a portion of the optional port region from the extended port region, wherein the portion of the optional port region comprises all optional port region parts not required for enabling connectivity of the integrated circuit; and defining, by the processor, the remainder of t ptional port region as the minimal port region.

4. The method of claim 1, wherein the extended port regions comprise areas located in different access layers of the integrated circuit.

5. A computer program product comprising a non-transitory computer readable storage medium having a computer readable program recorded therein, wherein the computer readable program, when executed on a computer, causes the computer to:
   create extended port regions for each ports in a set of ports of an integrated circuit, the extended port regions being shaped in such a way as to guarantee routing access to the ports, wherein each port in the set of ports is coupled to a circuit module in a set of circuit modules in the integrated circuit such that each circuit module comprises one or more ports, wherein each of the extended port regions to each comprise a minimal port area and an optional port region, wherein the minimal port area is a minimally required area for enabling connectivity of the circuit module and the optional port region is shaped so as to guarantee routing access to the port, and wherein the optional port region expands both in length and width beyond the minimal port area;
   place a wire corresponding to a net of the integrated circuit;
   trim the extended port regions of the ports, thus identifying essential port regions required for connecting the wire to the ports and dispensable port regions not required for connecting the wire to the ports, wherein trimming each of the extended port regions of slat of the ports further comprises:
     divide the optional port region into an essential port region required for connecting the minimal port region to the wire of the net and a dispensable port region that is not required for connecting the minimal port region to wiring of the net; and
     release the dispensable port region so that the dispensable port region no longer constitutes part of the port, wherein the dispensable port reduced is reduced in at least one of length or width; and
   update wiring resources by releasing the dispensable port regions so that the dispensable port regions no longer constitute parts of the ports.

6. The computer program product of claim 5, wherein the computer readable program to create the extended port region for the port further causes the computer to:
   create the minimal port area require for enabling at least one of functionality or reliability of the integrated circuit;
   create the optional port region shaped in such a way as to guarantee outing access to the port; and
   join the minimal port area to the optional port region to form the extended port region.

7. The computer program product of claim 5, wherein the computer readable program to create the extended port region for the port further causes the computer to:
   define the extended port; region, shaped in such a way as to guarantee routing access to the port;
   subtract a portion of the optional port region from the extended port region, wherein the portion of the optional port region comprises all optional port region parts not required for enabling connectivity of the integrated circuit; and
   define the remainder of optional port region as the minimal port region.

8. The computer program product of claim 5, wherein the extended port regions comprise areas located in different access layers of the integrated circuit.

9. A data processing system comprising:
   a processor; and
   a memory coupled to the processor, wherein the memory comprises instructions which, when executed by the processor, cause the processor to:
   create extended port regions each port in a set of ports of an integrated circuit, the extended port regions being shaped in such a way as to guarantee routing access to the ports, wherein each port in the set of ports is coupled to a circuit module in a set of circuit modules in the integrated circuit such that each circuit module comprises one or more ports, wherein each of the extended port regions to each port comprise minimal port area and an optional port region, wherein the minimal port area is a minimally required area for enabling connectivity of the circuit module and the optional port region is shaped so as to guarantee routing access to the port, and wherein the optional port region expands both in length and width beyond the minimal port area;
   place a wire corresponding to a net of the integrated circuit;
   trim the extended port regions of the ports, thus identifying essential port regions required for connecting the wire to the ports and dispensable port regions not required for connecting the wire to the ports, wherein trimming each of the extended port regions of each of the ports further comprises:
     divide the optional port region into an essential port region required for connecting the minimal port region to the wire of the net and a dispensable port region that is not required for connecting the minimal port region to wiring of the net; and
     release the dispensable port region so that the dispensable port region no longer constitutes part of the port, wherein the dispensable port region is reduced in at least one of length or width; and
   update wiring resources by releasing the dispensable port regions so that the dispensable port regions no longer constitute parts of the ports.

10. The data processing system of claim 9, wherein the instructions to create the extended port region for the port further cause the processor to:
   create the minimal port area required for enabling at least one of functionality or reliability of the integrated circuit;
   create the optional port region shaped in such a way as to guarantee routing access to the port; and
   join the minimal port area to the optional port region to form the extended port region.

11. The data processing system of claim 9, wherein the instructions to create the extended port region for the port further cause the processor to:
   define the extended port region shaped in such a way as to guarantee routing access to the port;
   subtract a portion of the optional port region from the extended port region, wherein the portion of the optional port region comprises all optional port region parts not required for enabling connectivity of the integrated circuit; and
   define the remainder of optional port region as the minimal port region.

12. The data processing system of claim 9, wherein the extended port regions comprise areas located in different access layers of the integrated circuit.

\* \* \* \* \*